United States Patent [19]

Laflin

[11] Patent Number: 5,396,522
[45] Date of Patent: Mar. 7, 1995

[54] METHOD AND APPARATUS FOR CLOCK SYNCHRONIZATION WITH INFORMATION RECEIVED BY A RADIO RECEIVER

[75] Inventor: Timothy C. Laflin, Ocean Ridge, Fla.

[73] Assignee: Motorola, Inc., Schaumburg, Ill.

[21] Appl. No.: 160,314

[22] Filed: Dec. 2, 1993

[51] Int. Cl.⁶ ............................................. H04L 7/06
[52] U.S. Cl. .................................... 375/364; 375/354; 327/141
[58] Field of Search ............... 375/113, 108, 111, 119, 375/120, 106; 328/63, 72; 307/480; 370/101.1, 102, 103; 358/50, 153, 410; 371/5.4, 42

[56] References Cited

U.S. PATENT DOCUMENTS

| | | | |
|---|---|---|---|
| 4,456,884 | 6/1984 | Yarborough | 375/110 |
| 4,596,937 | 6/1986 | Johnson | 375/120 |
| 4,984,255 | 1/1991 | Davis et al. | 375/106 |
| 5,027,085 | 6/1991 | Devito | 375/120 |

Primary Examiner—Edward L. Coles, Sr.
Assistant Examiner—Madeleine Anh-Vinh Nguyen
Attorney, Agent, or Firm—Kelly A. Gardner; John H. Moore

[57] ABSTRACT

A radio receiver (100) for receiving a radio frequency signal includes a receiver (110) for generating from the received signal a data signal having alternating first and second edges and a clock (135) for generating a clock signal having a clock period. Adjustment circuitry (400, 145) adjusts the clock period only on the first edges of the data signal when it is determined that adjustments of the clock period on the second edges would contradict adjustments of the clock period on the first edges. Conversely, the adjustment circuitry (400, 145) adjusts the clock period on both the first and the second edges of the data signal when it is determined that the adjustments of the clock period on the second edges would not contradict the adjustments of the clock period on the first edges.

19 Claims, 6 Drawing Sheets

FIG. 3 _PRIOR ART_

METHOD AND APPARATUS FOR CLOCK SYNCHRONIZATION WITH INFORMATION RECEIVED BY A RADIO RECEIVER

FIELD OF THE INVENTION

This invention relates in general to radio communication, and more specifically to communication wherein data bits are received by a radio receiver.

BACKGROUND OF THE INVENTION

Conventional radio communication systems involve the use of transmitting devices for providing information as a radio frequency (RF) signal. The information can be either analog or digital information that is encoded using one of various radio paging protocols, such as Golay Sequential Code, and then mixed with a carrier frequency for transmission over the air. A radio receiver subsequently receives the RF signal and demodulates it to recover the information included therein.

When digital information has been encoded and transmitted, the radio receiver demodulates the signal to generate a stream of data bits. A recovered clock within the radio receiver is then synchronized to the data bits such that the data bits can be sampled at predetermined times and recognized. In many conventional radio receivers, the data clock is started when the data bits are received, and, after a synchronization process has been undergone, the data bits are sampled, preferably at the center of each bit. During the synchronization process, the recovered clock edges are compared with the edges of the data bits, and the recovered clock signal is then adjusted accordingly. More specifically, when the rising edge of the clock is determined to have been early, the falling edge is delayed, and when the rising edge of the clock is determined to have been late, the falling edge occurs earlier than normal. In this manner, the clock signal becomes synchronized with the incoming data bits after a predetermined number of bits have been received.

A problem can occur when the duty cycle of the data bits is skewed and when both edges of the data are used for adjustment of the clock. In this circumstance, once the clock signal is one-hundred-eighty degrees out of phase with the incoming data bits, the skewed duty cycle causes the clock signal to remain out of phase. This occurs because the radio receiver, upon evaluation of the clock edges, first determines that the clock is late, then early, then late, etc. As a result, the clock cannot recover and insufficient information comprising the data bits will be presented to the user.

Thus, what is needed is a method and apparatus for better synchronizing to incoming digital data such that the clock signal does not lock 180° out of phase with respect to the data.

SUMMARY OF THE INVENTION

A radio receiver for receiving a radio frequency signal comprises a receiver for generating from the received signal a data signal having alternating first and second edges and a clock for generating a clock signal having a clock period. Adjustment circuitry adjusts the clock period only on the first edges of the data signal when it is determined that adjustments of the clock period on the second edges would contradict adjustments of the clock period on the first edges. Conversely, the adjustment circuitry adjusts the clock period on both the first and the second edges of the data signal when it is determined that the adjustments of the clock period on the second edges would not contradict the adjustments of the clock period on the first edges.

A radio receiver receives a radio frequency signal and generates therefrom a data signal having alternating first and second edges. The radio receiver includes a clock for generating a clock signal having a clock period. A method for synchronizing the clock signal with the data signal in the radio receiver comprises the steps of adjusting the clock period only on the first edges of the data signal when it is determined that adjustments of the clock period on the second edges would contradict adjustments of the clock period on the first edges, and adjusting the clock period on both the first and the second edges of the data signal when it is determined that the adjustments of the clock period on the second edges would not contradict the adjustments of the clock period on the first edges.

DESCRIPTION OF A PREFERRED EMBODIMENT

Figure 1:
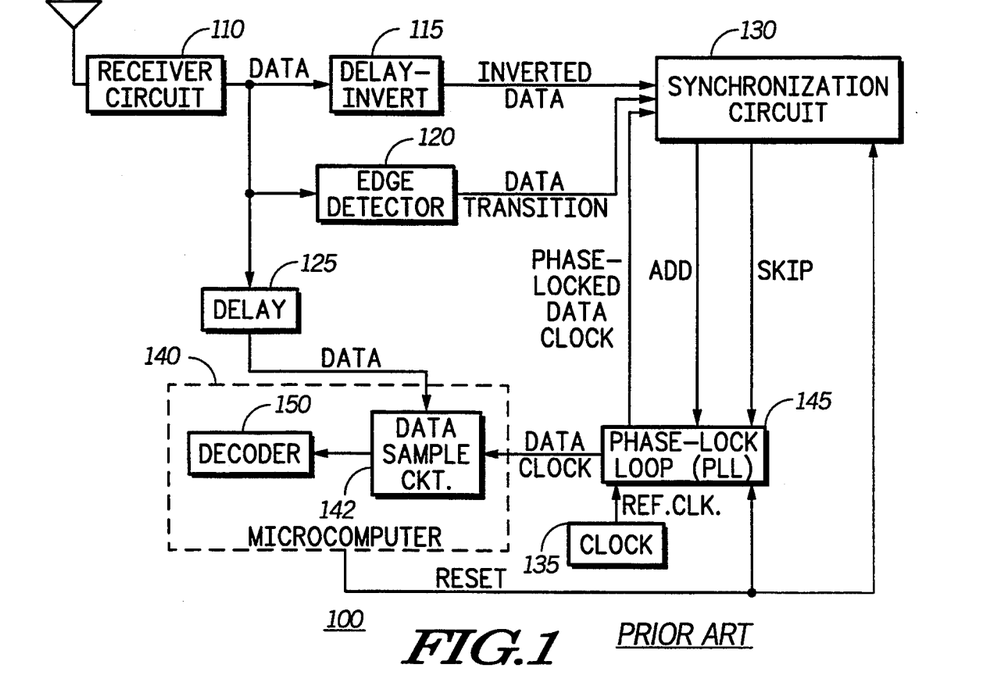
FIG. 1 is an electrical block diagram of a radio receiver for receiving radio frequency (RF) signals utilizing either a conventional synchronization circuit or a synchronization circuit in accordance with the present invention.

Referring to FIG. 1, an electrical block diagram of a radio receiver 100 for receiving digital information as a radio frequency (RF) signal is shown. The radio receiver 100 comprises an antenna 105 for receiving the RF signals and providing them to a receiver circuit 110, which demodulates the RF signal, thereby generating a stream of digital information. For example, when signalling protocols for sending binary information are used, the stream of digital information provided by the receiver circuit 110 is a signal having a minimum of two levels. Generally, the digital information is provided to a conventional delay-invert circuit 115, a conventional edge detector 120, and another conventional delay circuit 125. The delay-invert circuit 115, which may, for instance, comprise a conventional delay and an inverter (not shown) and the edge detector 120 are coupled to a conventional synchronization (sync) circuit 130 for synchronizing a clock 135 with the incoming data from the receiver circuit 110. The delay-invert circuit 115 provides an inverted data signal therefrom, and the edge detector 120 provides a signal to the sync circuit 130 each time the inverted data transitions from one level to another.

The delay circuit 125 is preferably coupled to a microcomputer 140 or other equivalent device which processes the delayed data to recover information included therein. The microcomputer 140 includes a data sample circuit 142 for sampling the delayed data at a rate determined by a data clock signal provided by a digital phase-locked loop (PLL) 145. The data sample circuit 142 generally determines, from a sample of each incoming bit of data, whether the bit is high or low. In systems which use greater than two-level signalling, e.g., four level signalling systems, the data sample circuit 142 can determine which of several levels is representative of the incoming bit. For each bit of data, the data sample circuit 142 then transmits an appropriate signal to a decoder 150, which can also be included in the microcomputer 140. The decoder 150 processes the indicative signals from the data sample circuit 142 to recover a message or other information that was transmitted in the RF signal. This information can then be presented to a user audibly and/or visually.

The PLL 145 receives timing signals from the clock 135, which can be implemented using a conventional crystal oscillator (not shown), then divides the timing signals to provide the data clock signal to the sync circuit 130. The data clock is usually initially set to have a period equivalent to that of the anticipated period of the incoming data with a predetermined number of cycles of the reference clock 135 per bit period. The predetermined number can be, for instance, sixteen. This initial setting is established, for instance, when the sync circuit 130 and the PLL 145 have been reset by the microcomputer 140 at power up of the radio receiver 100. The sync circuit 130 then compares the data clock signal to the inverted data received from the delay-invert circuit 115 each time the inverted data transitions, as indicated by the signal provided by the edge detector 120, in order to provide outputs to the PLL 145. In response to reception of the outputs, the PLL 145 adjusts the data clock such that it is synchronized with the inverted data.

Conventionally, the sync circuit 130 provides information, at each data transition, by which the clock period can be adjusted to bring the data clock into synchronization with the inverted data. This adjustment generally comprises either an increase or a decrease in the period of the data clock signal by the PLL 145, and the adjustment can be accomplished, for example, by adding or subtracting, respectively, a cycle of the reference clock 135 to or from the data clock signal, thereby bring rising edges of the data clock into synchronization with rising edges of the inverted data. The information provided by the sync circuit 130 to the PLL 145 is typically either an "add" signal, when the period of the clock signal is to be increased, or a "skip" signal, when the period of the clock signal is to be decreased. The PLL 145 then adjusts the data clock signal accordingly and provides a corrected data clock signal to the data sample circuit 142 and back to the sync circuit 130.

In this manner, the data clock signal is gradually brought into synchronization with the data generated by the receiver circuit 110 such that the data sample circuit 142 samples the data at the correct times. Preferably, the data sample circuit 142 is set to sample the data as close as possible to the center of each bit of data, thereby avoiding situations in which incorrect timing causes a bit of data to be construed erroneously.

However, the conventional sync circuit 130 normally utilized to provide synchronization to the data does not always give accurate results when the duty cycle of the incoming data is skewed, e.g., when the time in which the data is high is not equivalent to the time in which the data is low during a single bit time.

Figure 2:
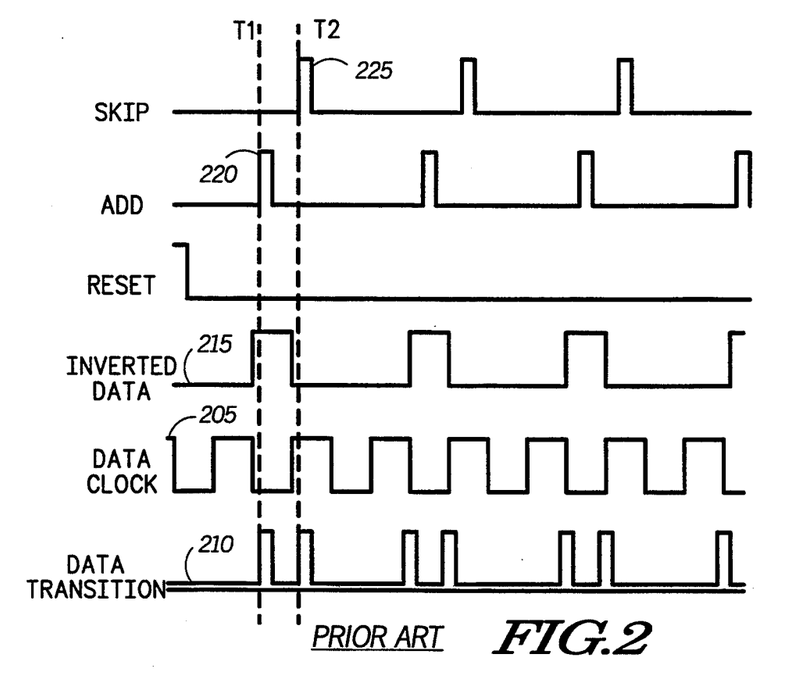
FIG. 2 is a timing diagram illustrating the operation of a conventional synchronization circuit which can be included in the radio receiver of FIG. 1.

Referring next to FIG. 2, a timing diagram illustrates the operation of the conventional sync circuit 130 (FIG. 1) when the inverted data is characterized by a 75/25% duty cycle. Once the sync circuit 130 is enabled, the data clock signal 205 is compared with the data transition signal 210 when the data transition signal 210 goes high, indicating that the inverted data signal 215 has transitioned between different signal levels. When the data transition signal 210 is high and the clock signal 205 is low, at time t1, the sync circuit 130 generates an "add" pulse 220 for a predetermined time, such as one-sixteenth of a bit period, in attempt to remedy the "late" clock signal 205. In response to reception of the add pulse 220, the PLL 145 (FIG. 1) adjusts the clock signal 205 by adding a tick in attempt to synchronize it with the inverted data signal 215. However, when the data again transitions, at time t2, the sync circuit 130 compares the data transition signal 210 with the clock signal 205 and determines that the clock signal 205 is early. In response to this determination, the sync circuit 130 generates a "skip" pulse 225, reception of which indicates to the PLL 145 that a tick of the clock signal 205 is to be skipped.

This contradictory information results in a tick being added to the clock signal 205 at each rising edge of the data signal 215 and a tick being subtracted from the clock signal 205 at each falling edge of the data signal 215. Therefore, the data clock signal 205 becomes locked one-hundred-eighty degrees (180°) out of phase with the data signal 205, and synchronization is never achieved. As a result, the radio receiver 100 (FIG. 1) can entirely miss information provided thereto within a communication system to which a user of the radio receiver 100 subscribes.

Figure 3:
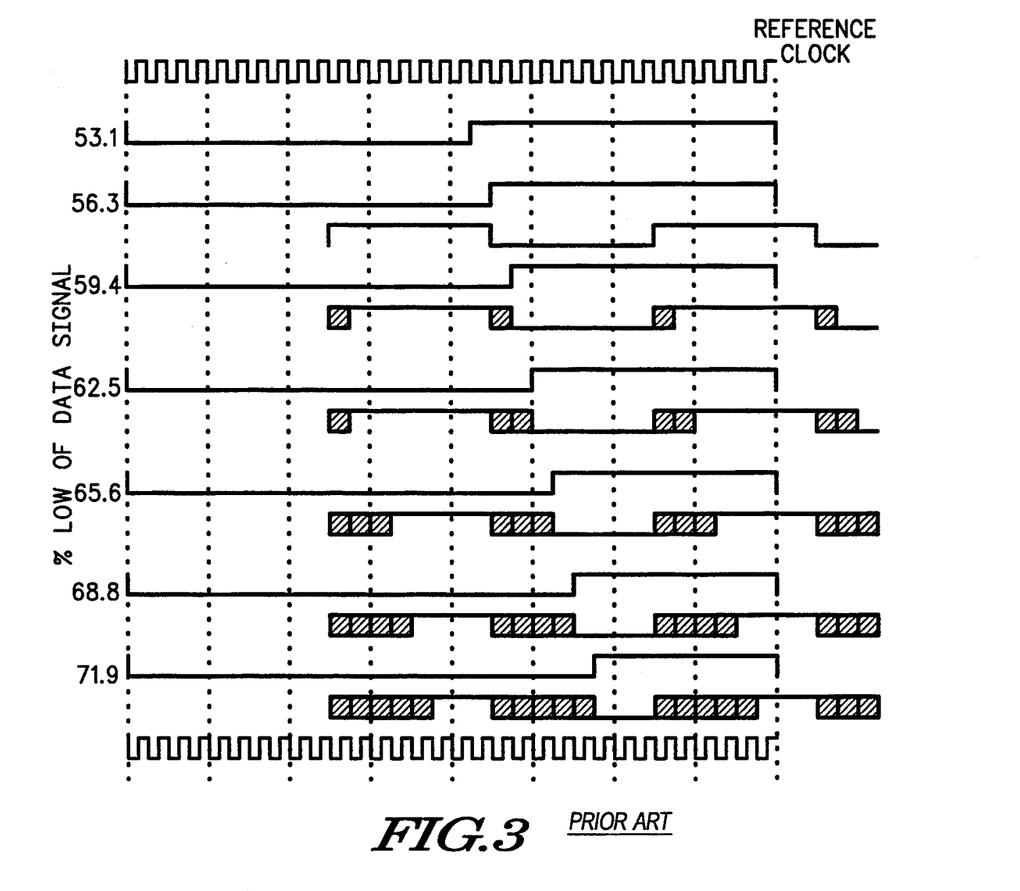
FIG. 3 is a signal diagram of data having a skewed duty cycle and times associated therewith during which the conventional synchronization circuit can become locked out of phase with the data.

FIG. 3 is a timing diagram which illustrates, for some conventional radio receivers, the time periods, represented by the shaded areas, during which the sync circuit 130 will lock out of phase if the duty cycle of the incoming data signal is skewed and if the sync circuit 130 is enabled at that time. As shown, the windows during which the sync circuit 130 can lock out of phase increase as the duty cycle of the data signal becomes more skewed. In other words, as the duty cycle becomes less even, the likelihood that the sync circuit 130 will lock 180° out of phase increases.

Figure 4:
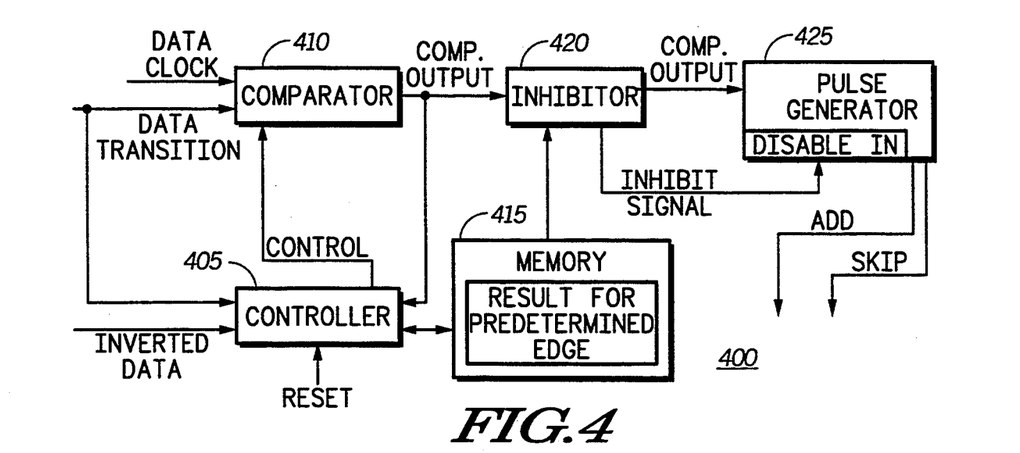
FIG. 4 is a block diagram depicting a synchronization circuit in accordance with the present invention which can be utilized in the radio receiver of FIG. 1.

FIG. 4 is a block diagram of a sync circuit 400, in accordance with the present invention, which can replace the conventional sync circuit 130 within the radio receiver 100 (FIG. 1). Preferably, the sync circuit 400 comprises a controller 405 for receiving the inverted data from the delay-invert circuit 115 (FIG. 1) and for receiving the reset signal from the microcomputer 140. The controller 405 is coupled to a comparator 410, which is enabled by the controller 405, and to a memory 415, which stores the comparator output for predetermined edges, e.g., rising edges, of incoming data. The sync circuit 400 further comprises, in accordance with the present invention, an inhibitor 420 coupled to the output of the comparator 410 and the to memory 415 for inhibiting the transfer of the comparator output to a pulse generator 425 when the output of the comparator 410 contradicts the stored value in the memory 415 on negative data edges. When not inhibited, the pulse generator 425 receives, via the inhibitor 420, the comparator output and generates an appropriate add or skip pulse. The pulse provided by the pulse generator is provided, as described above, to the PLL 145 (FIG. 1).

Figure 5:
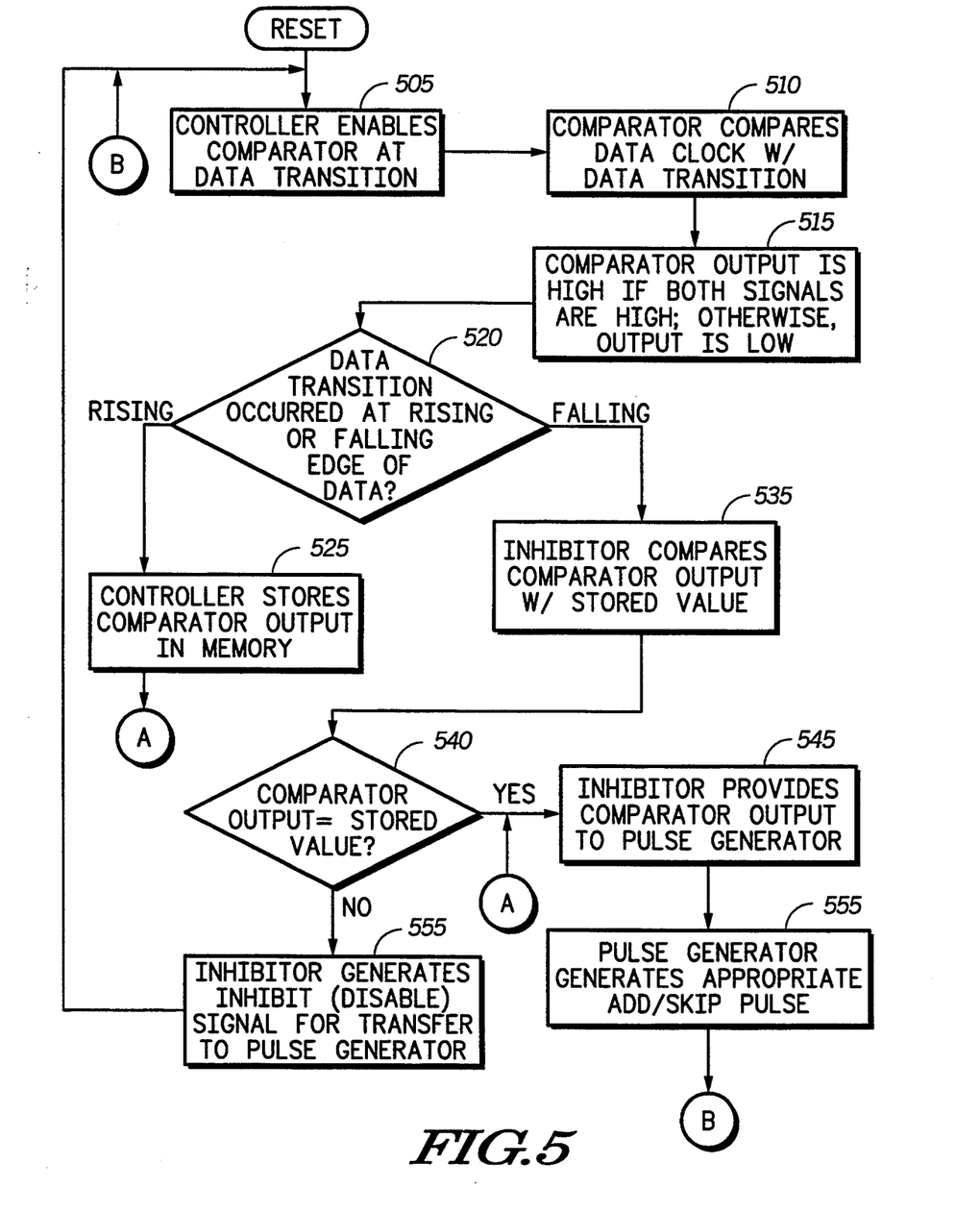
FIG. 5 is a flow chart illustrating the operation of the synchronization circuit of FIG. 4 in accordance with the present invention.

The operation of the sync circuit 400 can be better understood by referencing FIG. 5, which is a flowchart of the operation of the sync circuit 400. Preferably, the controller 405, at step 505, enables the comparator 410 after reset by the microcomputer 140 (FIG. 1) and when a data transition of the inverted data occurs. The comparator 410 thereafter compares, at step 510, the signal level, e.g., high or low, of the data transition signal with the signal level, e.g., high or low, of the data clock signal, and provides, at step 515, a signal indicative of the states of the data clock signal and the data transition signal. By way of example, the comparator 410 could generate a signal having a high voltage level when both the data transition and data clock signals are high and a signal having a low voltage level when the data transition signal is high and the clock signal is low. Upon reception of the comparator output, the controller 405 determines, at step 520, whether the data transition associated with the comparator output occurred at a predetermined edge, such as the rising edge, of the inverted data signal. When the data transition occurred at a rising edge, a value indicative of the comparator output is stored, at step 525, in the memory 415, and the comparator output is provided, at step 545, to the pulse generator 425, which generates, at step 550, an appropriate "add" or "skip" pulse.

Conversely, when the data transition occurred at a falling edge, the inhibitor 420 compares, at step 535, the output of the comparator 410 with the value stored in the memory 415. When, at step 540, the comparator output is equal to the stored value, the inhibitor 420 simply provides, at step 545, the comparator output to the pulse generator 425, which, at step 550, generates an appropriate add or skip pulse for transmission to the PLL 145 (FIG. 1). Preferably, when the comparator output is high, indicating that the data clock signal transition is early, the pulse generator 425 generates a skip pulse, and, when the comparator output is low, indicating that the clock signal transition is late, the pulse generator 425 generates an add pulse. When, on the other hand, the comparator output is not equivalent to the stored value, the inhibitor 420 generates, at step 555, an inhibit, or disable, signal for transmission to the pulse generator 425, which is thereby disabled such that neither an add nor a skip pulse is generated.

In accordance with the present invention, the sync circuit 400 conveniently eliminates the 180° out of phase lock-up problem because it utilizes the memory 415 to store the results of the comparison between the data transition signal and the clock signal at predetermined edges of the inverted data signal to inhibit the generation of contradictory add/skip pulses at alternating edges of the inverted data. As a result, when the sync circuit 400 is enabled during one of the time windows of FIG. 3, pulses contradicting those generated during the rising data edges are inhibited, thereby preventing the data clock signal from locking 180° out of phase. Once the add/skip pulses at alternating rising and falling edges are no longer contradictory, add/skip pulses are provided to the PLL 145 at each edge, rising and falling, of the inverted data signal such that synchronization can be acquired very quickly. It will be recognized that, alternatively, the falling, rather than the rising, edges can be used in the determination of the stored values until the data clock signal has moved out of the time window during which 180° out of phase lock-up can occur without materially changing the results provided by the sync circuit 400.

Figure 6:
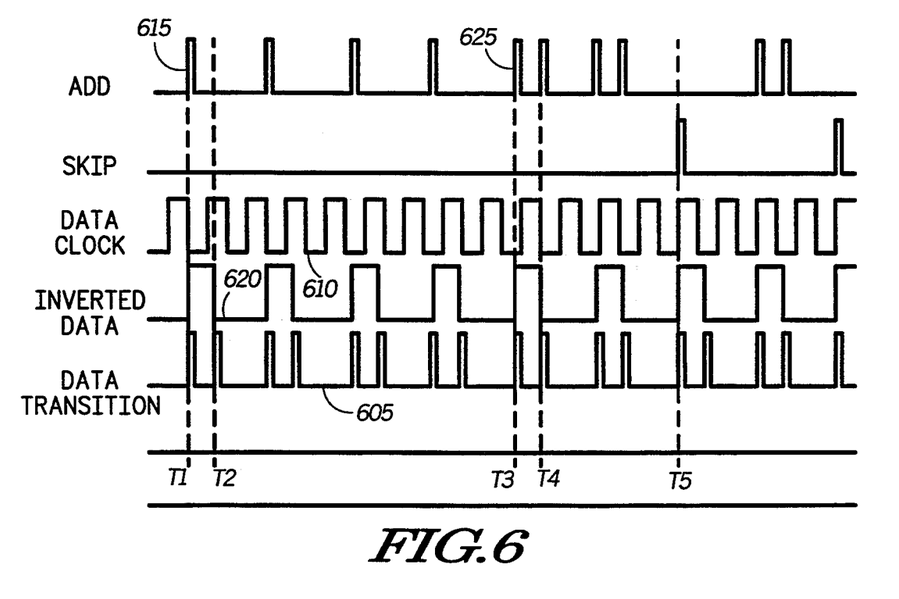
FIG. 6 is a timing diagram of signals received by and transmitted from the synchronization circuit of FIG. 4 in accordance with the present invention.

Referring next to FIG. 6, a timing diagram illustrates the operation of the sync circuit 400 according to the present invention. At t1, the data transition signal 605 goes high, and a comparison of the data transition signal 605 and the data clock signal 610 reveals that the data clock signal 610 is late. Accordingly, an add pulse 615 is generated to indicate to the PLL 145 that a tick should be added to the data clock signal 610. Because this data transition occurred at a rising edge, which, for this example, is the predetermined edge of the inverted data signal 620, the result, i.e., "add", is stored in the memory 415 (FIG. 4). Thereafter, at time t2, the data transition signal 605 and the data clock signal 610 are compared again at the falling edge of the inverted data signal 620. This comparison indicates that the clock is early, and, since this result contradicts that obtained at the previous rising edge of the inverted data signal 620, the result, i.e., "skip", is inhibited, thereby preventing the data clock signal 610 from synchronizing with the inverted data signal 620 one-hundred-eighty degrees out of phase. The "skip" pulse at the falling edges of the inverted data signal 620 are inhibited until a later time when the pulses are no longer contradictory.

At t3, the data transition signal 605 is high, and the data clock signal 610 is low, resulting in an add pulse 625 at the rising edge of the inverted data signal 620. However, at the next falling edge of the inverted data signal 620, at time t4, the data transition signal 605 is again high, and the data clock signal 610 is again low. Therefore, since the result, i.e., "add", does not contradict the previous pulse, the add pulse 630 is not inhibited. From this time forward, add/skip pulses at both edges, rather than a single edge, of the inverted data signal 620 are utilized to adjust the data clock signal 610 such that synchronization, at time t5, can be obtained very quickly. Consequently, the sync circuit 400 according to the present invention advantageously avoids the out of phase lock-up problem of the conventional sync circuit 130 (FIG. 1) while allowing rapid synchronization with the inverted data signal 620.

According to a first embodiment of the present invention, the sync circuit 400 can be implemented entirely in software. For example, a digital signal processor, such as a DSP56000 manufactured by Motorola, Inc., can be employed for performance of the necessary synchronization operations. Alternatively, the sync circuit 400 can be implemented through use of hard-wired logic.

Figure 7:
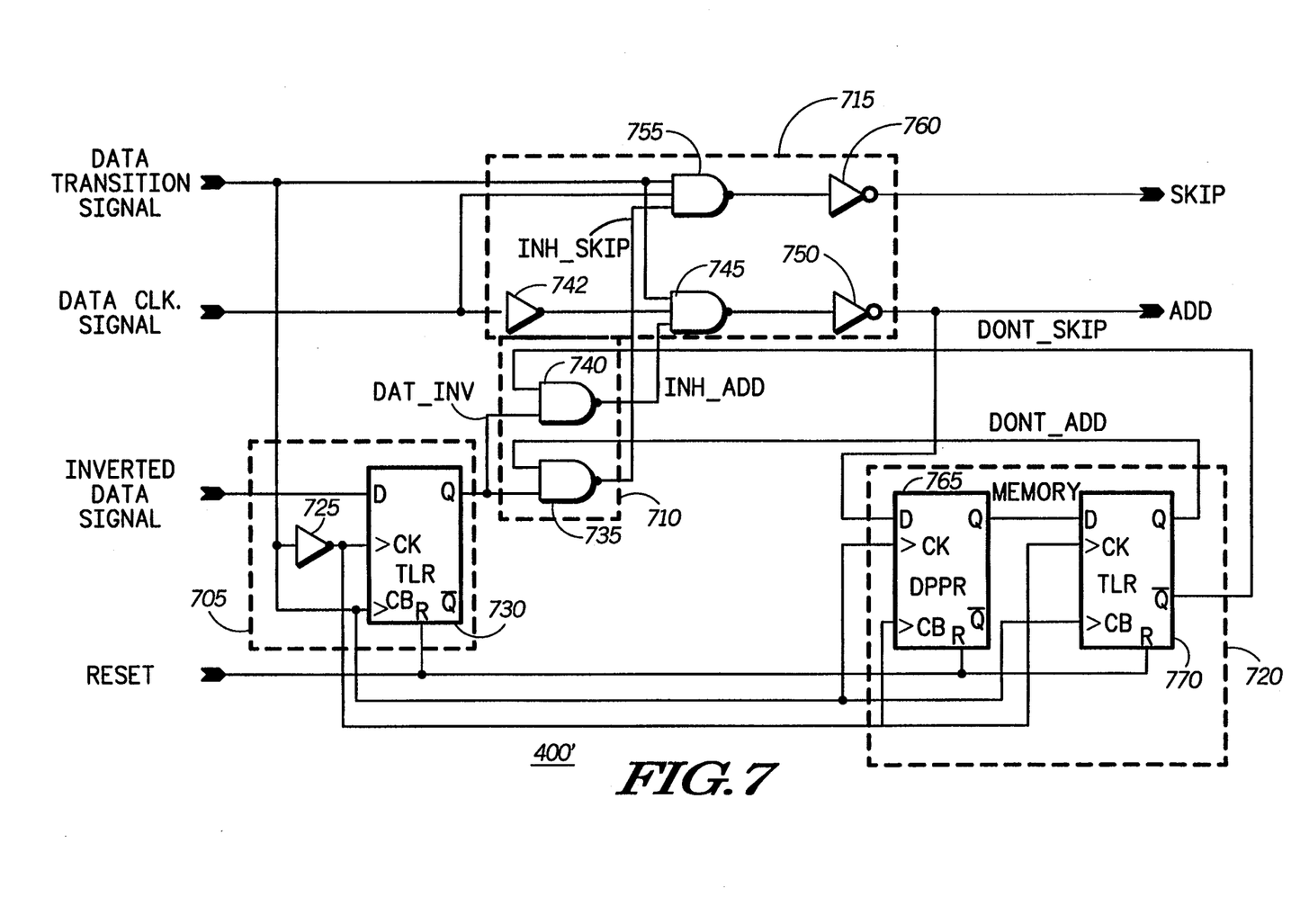
FIG. 7 is an electrical circuit diagram of hardwired logic which can be utilized to implement the synchronization circuit of FIG. 4 in accordance with the present invention.

Referring next to FIG. 7, a circuit diagram depicts an example of a hard-wired logic circuit which can be employed as a sync circuit 400' in accordance with a second embodiment of the present invention. The circuit 400' preferably comprises a control section 705, an inhibit section 710, a comparison and pulse generation section 715, and a memory section 720. The control section 705, according to the second embodiment of the present invention, includes an inverter 725 having an input coupled to the data transition signal and having an output coupled to a first clock input CK of a conventional half-latch 730. The half-latch 730 also comprises a second clock input CB to which the data transition signal is coupled, a RESET input, and a Q output providing the signal dat_inv.

The inhibit section 710 preferably comprises first and second NAND gates 735, 740 having two inputs. First inputs of NAND gates 735, 740 are coupled to the Q output of half-latch 730, and second inputs of NAND gates 735, 740 are coupled to the memory section 720. The second input of NAND gate 735 receives the signal dont_add from the memory section 720, and the second input of NAND gate 740 receives the signal dont_skip from the memory section 720. The outputs of NAND gates 735, 740 are coupled to the comparison and pulse generation section 715. The output of NAND gate 735 provides the signal inh_skip, and the output of NAND gate 740 provides the signal inh_add.

Preferably, the comparison and pulse generation section 715 comprises an inverter 742 having an input for receiving the data clock signal and having an output coupled to a first input of a NAND gate 745, which further includes a second input coupled to the output of NAND gate 740 and a third input coupled to the data transition signal. The output of NAND gate 745 is coupled to an inverter 755, which provides add pulses to the PLL 145 (FIG. 1). The comparison and pulse generation section 715 further comprises a NAND gate 755 having a first input coupled to the output of NAND gate 735, a second input coupled to the data clock signal, and a third input coupled to the data transition signal. The output of NAND gate 755 is coupled to an inverter 760, which provides skip pulses.

The memory section 720 of the sync circuit 400' includes a D flip-flop 765 and a half-latch 770. D flip-flop 765 has a D input coupled to the output of inverter 750, a CB input coupled to the output of inverter 725, a CK input for receiving the data transition signal, and a RESET input for receiving reset signals. The Q output of D flip-flop 765 is coupled to the D input of half latch 770. Half-latch 770 also includes a CK input coupled to the output of inverter 725, a CB input to which the data transition signal is coupled, and a RESET input. A Q output provides the signal dont_add, and an inverted Q output provides the signal dont_skip.

Figure 8:
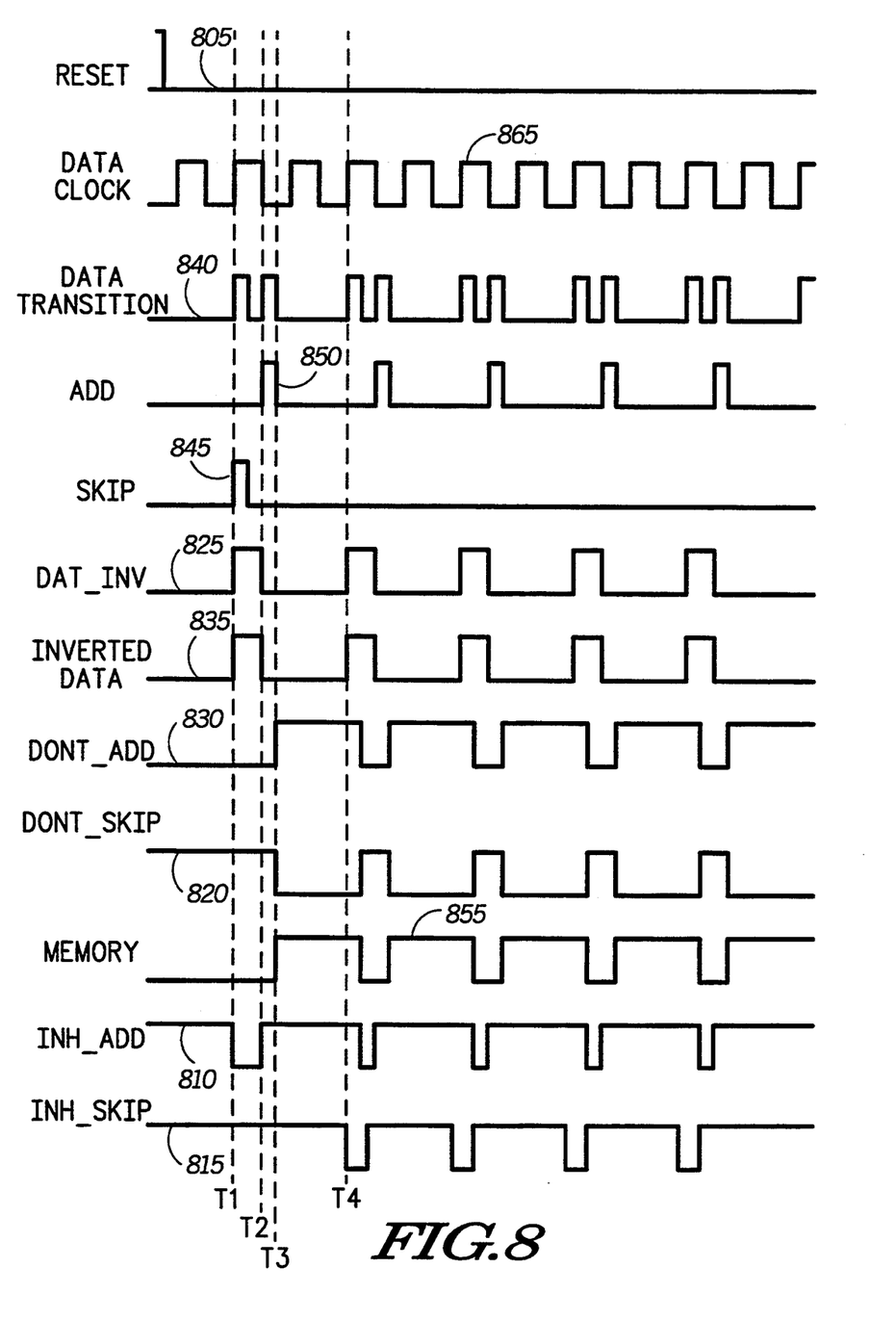
FIG. 8 is a timing diagram of signals received by, transmitted from, and internal to the hardwired logic of FIG. 7 in accordance with the present invention.

Referring next to FIG. 8, a timing diagram illustrates the signals generated within the sync circuit 400' when the circuit 400' is set such that the add/skip pulses generated at falling edges are stored. For illustrative purposes only, the PLL 145 (FIG. 1) has been disabled to better depict the signals. As shown, after reception of a reset signal 805, the signals inh_add 810, inh_skip 815, and dont_skip 820 are high, while the signals dat_inv 825 and dont_add 830 are initially low. When, at t1, the inverted data signal 835 transitions, the data transition signal 840 and the dat_inv signal 825 go high, and the inh_add signal 810 goes low. Additionally, as a result, a skip pulse 845 is generated for transmission to the PLL 145 (FIG. 1). Thereafter, at time t2, the inverted data signal 835 again transitions, and the data transition signal 840 goes high, which causes the dat_inv signal 825 to go low and the inh_add signal 810 to go high. Consequently, an add pulse 850 is generated.

At time t3, during storage of a value indicative of the add pulse 850, the dont_add signal 830 and the memory signal 855 go high, and the dont_skip signal 820 goes low. Next, at t4, the inverted data signal 835 transitions, causing the dat_inv signal 825 to go high and the inh_skip signal 815 to go low, thereby inhibiting the contrary skip pulse which would otherwise result. Because, in this example, the PLL 145 is disabled, the sync circuit 400' continues to inhibit each skip pulse which is contrary to the add pulses generated at the falling edges of the inverted data signal 835. As a result, the data clock signal 865 does not lock 180° out of phase with the inverted data signal 835.

In summary, the radio receiver as described above uses a synchronization circuit according to the present invention to quickly synchronize a clock signal to incoming data without experiencing out of phase lock-up problems when the duty cycle of the incoming data is skewed. Preferably, in response to a first edge, e.g., a rising edge, of the data, the synchronization circuit initially generates either an add pulse, indicating that the period of the clock signal should be increased, or a skip pulse, indicating that the period of the clock signal should be decreased. A value indicative of this adjustment is then stored in a memory section. Thereafter, at a second edge, e.g., a falling edge, of the data, the synchronization circuit determines whether an add pulse or a skip pulse should be generated and, if the appropriate pulse contradicts that which was previously generated at the rising edge, the pulse is inhibited. Therefore, the clock signal is not subjected to contrary adjustments at each alternating edge of the data. As a result, the 180° out of phase lock-up problem experienced by conventional synchronization circuits is eliminated. Once the pulses at the falling edges of the data are no longer contradictory, these pulses are no longer inhibited, and the clock signal can be brought into synchronization with the data very rapidly.

It will be appreciated by now that there has been provided a synchronization circuit for rapidly synchronizing a clock signal with incoming data. Additionally, the synchronization circuit can recover from situations in which the clock signal is 180° out of phase with the data while using both edge polarities to adjust the clock signal.

What is claimed is:

1. A method for synchronizing a clock signal with a data signal having alternating first and second edges in a radio receiver for receiving a radio frequency signal and generating therefrom the data signal, the radio receiver comprising a clock for generating the clock signal, which has a clock period, the method comprising the steps of:
    adjusting the clock period on one of the first edges Of the data signal by increasing the clock period when the clock signal is late with respect to the data signal and by decreasing the clock period when the clock signal is early with respect to the data signal;
    inhibiting adjustment of the clock period on one of the second edges of the data signal following the one of the first edges when the clock signal is early with respect to the data signal and when, on the one of the first edges of the data signal, the clock period was increased; and
    inhibiting adjustment of the clock period on the one of the second edges of the data signal when the clock signal is late With respect to the data signal and when, on the one of the first edges of the data signal, the clock period was decreased.

2. The method according to claim 1, further comprising the step of:
    storing, prior to the inhibiting steps, a value indicating whether, on the one of the first edges of the data signal, the clock period was decreased or increased.

3. The method according to claim 2, further comprising the step of:

determining, prior to the adjusting step, that the clock signal is not synchronized with the data signal.

4. The method according to claim 3, further comprising the step of:

determining, prior to the inhibiting steps, that the clock signal is not synchronized with the data signal.

5. The method according to claim 4, further comprising, prior to the adjusting step, the step of:

comparing the clock signal with a first data transition signal to determine whether the clock signal is early or late with respect to the data signal.

6. The method according to claim 5, further comprising, prior to the inhibiting steps, the step of:

comparing the clock signal with a second data transition signal to determine whether the clock signal is early or late with respect to the data signal.

7. The method according to claim 1, further comprising, subsequent to the adjusting step, the steps of:

adjusting the clock period on the one of the second edges of the data signal by increasing the clock period when the clock signal is late With respect to the data signal when, on the one of the first edges of the data signal, the clock period was increased; and adjusting the clock period on the one of the second edges of the data signal by decreasing the clock period when the clock signal is early with respect to the data signal when, on the one of the first edges of the data signal, the clock period was decreased.

8. The method according to claim 1, wherein the adjustment step comprises the steps of:

generating an add pulse on the one of the first edges of the data signal to indicate that the clock period should be increased when the clock signal is late with respect to the data signal; and generating a skip pulse on the one of the first edges of the data signal to indicate that the clock period should be decreased when the clock signal is early with respect to the data signal.

9. A radio receiver for receiving a radio frequency signal, the radio receiver comprising:

a receiver circuit for generating from the radio frequency signal a data signal having alternating first and second edges;

a clock for generating a clock signal having a clock period; and adjusting means for adjusting the clock period on one of the first edges of the data signal by increasing the clock period when the clock signal is late with respect to the data signal and by decreasing the clock period when the clock signal is early with respect to the data signal;

first inhibiting means for inhibiting adjustment of the clock period on one of the second edges of the data signal following the one of the first edges when the clock signal is early with respect to the data signal and when, on the one of the first edges of the data signal, the clock period was increased; and second inhibiting means for inhibiting adjustment of the clock period on the one of the second edges of the data signal when the clock signal is late with respect to the data signal and when, on the one of the first edges of the data signal, the clock period was decreased.

10. The radio receiver according to claim 9, wherein the adjusting means comprises a memory for storing a value indicative of whether, on the one of the first edges of the data signal, the clock period was increased or decreased.

11. The radio receiver according to claim 9 wherein the adjusting means comprises:

a synchronization circuit coupled to the clock and the receiver circuit for generating information by which the clock signal can be adjusted responsive to the data signal; and a phase-locked loop coupled to the synchronization circuit and the clock for increasing and decreasing the clock period of the clock signal in accordance with the information provided by the synchronization circuit.

12. The radio receiver according to claim 11, further comprising:

a data sample circuit coupled to the phase-locked loop and the receiver circuit for sampling the data signal at a rate determined by the clock signal to determine bit values for the data signal; and a decoder coupled to the data sample circuit for recovering a message from the data signal based on the bit values.

13. The radio receiver according to claim 11, further comprising an edge detector coupled to the receiver circuit and the synchronization circuit for generating a data transition signal.

14. The radio receiver according to claim 13, wherein the synchronization circuit comprises:

a comparator for comparing the clock signal with the data transition signal and for generating a comparator output having a first value when the clock signal and the data signal have equivalent signal levels and having a second value when the clock signal and the data signal have different signal levels;

a memory for storing selected comparator outputs;

a controller coupled to the comparator and the memory for receiving the data signal and the data transition signal and enabling the comparator when the data transition signal is high, wherein the controller further receives the comparator output and, when the comparator output occurs responsive to a predetermined edge of the data signal, stores the comparator output in the memory;

a pulse generator coupled to the comparator for receiving the comparator output and for generating in accordance therewith a pulse, wherein the pulse comprises an add pulse, indicating that the clock period should be increased, or a skip pulse, indicating that the clock period should be decreased; and an inhibitor, comprising the first and second inhibiting means and coupled to the memory, the comparator, and the pulse generator, for inhibiting generation of the pulse by the pulse generator when the comparator output is not equivalent to a previously stored comparator output and when the comparator output does not occur responsive to the predetermined edge of the data signal.

15. The radio receiver according to claim 14, wherein the controller comprises:

a first inverter having an input for receiving the data transition signal and an output; and a first half-latch including a D input for receiving the data signal, a first clock input coupled to the output of the first inverter, a second clock input for receiving the data transition signal, and a Q output.

16. The radio receiver according to claim 15, wherein the inhibitor comprises:
- a first NAND gate having a first input coupled to the Q output of the first half-latch, a second input coupled to the memory, and an output; and
- a second NAND gate having a first input coupled to the Q output of the first half-latch, a second input coupled to the memory, and an output.

17. The radio receiver according to claim 16, wherein the comparator and the pulse generator comprise:
- a second inverter having an input for receiving the clock signal and having an output;
- a third NAND gate including a first input coupled to the output of the second inverter, a second input coupled to the output of the second NAND gate, a third input, and an output;
- a fourth NAND gate including a first input coupled to the output of the first NAND gate, a second input for receiving the clock signal, a third input for receiving the data transition signal, and an output;
- a third inverter having an input coupled to the output of the third NAND gate and having an output for providing the add pulse; and
- a fourth inverter having an input coupled to the output of the fourth NAND gate and having an output for providing the skip pulse.

18. The radio receiver according to claim 17, wherein the memory comprises:
- a D flip-flop including a D input coupled to the output of the third inverter for receiving the add pulse, a first clock input for receiving the data transition signal, a second clock input coupled to the output of the first inverter, and a Q output; and
- a second half-latch including a D input coupled to the Q output of the D flip-flop, a first clock input coupled to the output of the first inverter, a second clock input for receiving the data transition signal, a Q output coupled to the second input of the first NAND gate, and an inverted Q output coupled to the second input of the second NAND gate.

19. A radio receiver for receiving a radio frequency signal, the radio receiver comprising:
- a receiver circuit for generating from the radio frequency signal a data signal having alternating first and second edges;
- a clock for generating a clock signal having a clock period;
- a synchronization circuit coupled to the clock and the receiver circuit for generating information by which the clock signal can be synchronized to the data signal, wherein the synchronization circuit comprises:
  - adjusting means for indicating, on one of the first edges of the data signal, that the clock period should be increased when the clock signal is late with respect to the data signal and by decreasing the clock period when the clock signal is early with respect to the data signal;
  - first inhibiting means for indicating, on one of the second edges of the data signal following the one of the first edges, that adjustment of the clock period should be inhibited when the clock signal is early with respect to the data signal and when, on the one of the first edges of the data signal, the clock period was increased; and
  - second inhibiting means for indicating, on the one of the second edges of the data signal following the one of the first edges, that adjustment of the clock period should be inhibited when the clock signal is late with respect to the data signal and when, on the one of the first edges of the data signal, the clock period was decreased; and
- a phase-locked loop coupled to the synchronization circuit and the clock for increasing and decreasing the clock signal in accordance with the information provided by the synchronization circuit.

* * * * *